United States Patent [19]

Suarez

[11] Patent Number: 5,081,427
[45] Date of Patent: Jan. 14, 1992

[54] FAST LOCK TIME PHASE LOCKED LOOP

[75] Inventor: Jose I. Suarez, Miami, Fla.

[73] Assignee: Motorola, Inc., Schaumburg, Ill.

[21] Appl. No.: 619,648

[22] Filed: Nov. 29, 1990

[51] Int. Cl.$^5$ .............................................. H03L 7/00
[52] U.S. Cl. ...................................... 331/10; 331/17; 331/25
[58] Field of Search ................... 331/10, 17, 18, 25

[56] References Cited

U.S. PATENT DOCUMENTS

| | | | |
|---|---|---|---|
| 3,701,039 | 10/1972 | Lang et al. ........................ | 331/1 A |
| 4,009,450 | 2/1977 | Holcomb et al. .................. | 331/17 |
| 4,093,926 | 6/1978 | Lamarche .......................... | 331/11 |
| 4,684,901 | 8/1987 | Kawano ............................. | 331/25 |

Primary Examiner—Robert J. Pascal
Attorney, Agent, or Firm—Daniel K. Nichols; Thomas G. Berry

[57] ABSTRACT

A fast locking phase locked loop includes a first integrator that provides a signal representing a function of the mathematical or ideal integral of the phase difference between an input signal and a feedback signal. A voltage controlled oscillator is coupled to the first integrator and provides a signal to a phase shifter that provides the phase shifted signal that represents a function of the phase of the signal from the VCO, and a function of the integral of the phase difference between the integrated signals.

7 Claims, 6 Drawing Sheets

PHASE DETECTOR

FIG.6
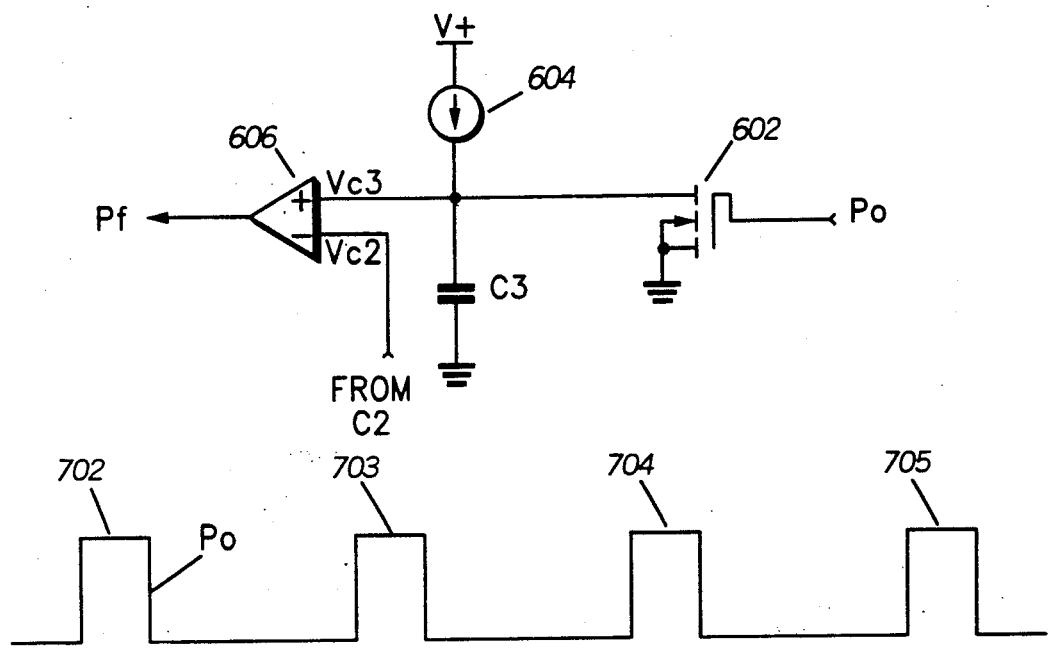
FIG.7A
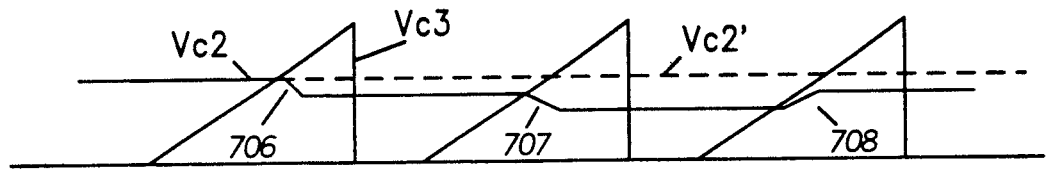
FIG.7B
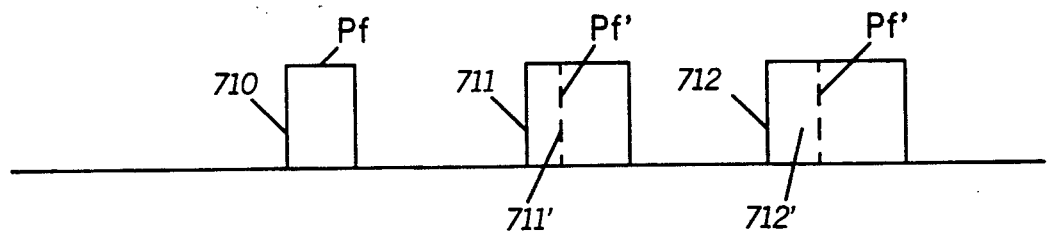
FIG.7C

FAST LOCK TIME PHASE LOCKED LOOP

FIELD OF THE INVENTION

This invention pertains to phase locked loops, and more particularly to a phase locked loop that includes a phase modulator in the feedback path between the VCO output and the feedback input of the phase detector.

BACKGROUND

In FIG. 1, a schematic diagram of a conventional phase locked loop 100 is illustrated. Referring to this figure, a well known phase detector and charge pump 102 typically includes a digital phase detector and a "tri-state" charge pump, such as the ones illustrated in FIGS. 2A and 2B, respectively.

Referring to FIGS. 2A and 2B, the phase detector compares the phase $P_i$ of an input signal against the phase $P_f$ of a feedback signal. If $P_f$ lags $P_i$, the phase detector outputs a logic 0 at μ-not. If $P_f$ leads $P_i$, the phase detector outputs a logic 0 at D-not. If $P_f$ and $P_i$ are in phase, U-not and D-not are both high. A logic 0 at μ-not turns on transistor 202, which in turn activates a constant current source that includes resistors 204–206, diode 208 and transistor 210. When activated, this current source causes a constant positive current of magnitude $I_{peak}$ to flow from the output of the charge pump into a loop filter 104. Similarly, a logic 0 at D-not turns on transistor 212 which in turn activates a constant current sink that includes resistors 214–216, diode 218 and transistor 220. This current sink causes a constant negative current of magnitude $I_{peak}$ to flow from loop filter 104 back into the charge pump.

A suitable linear model or transfer function for phase detector/charge pump 102 is:

$$I_p/P_e = K_p \qquad (1),$$

wherein $P_e$ is the phase error ($P_i - P_f$) and $K_p$ is the gain factor for phase detector/charge pump 102. $K_p$ is directly proportional to the magnitude $I_{peak}$ of the current sourced and sinked by the charge pump. (It should be noted that the transfer function for the phase detector/charge pump is not entirely correct. The equation requires that the amplitude of the output current be directly proportional to the phase error $P_e$, but the actual output of the phase detector/charge pump is current pulses of constant amplitude $I_{peak}$. However, the duration of the pulses is proportional to the phase error $P_e$. As will be described below, the filter 104 integrates the output current $I_p$ to produce the error voltage $V_e$. Since the filter integrates the current $I_p$, the error voltage output $V_e$ predicted by the mathematical model will be substantially the same as the actual error voltage.)

Returning to FIG. 1, the loop filter 104 includes a capacitor which integrates the output current $I_p$, and a resistor R, which affects the dynamic characteristics of the phase locked loop, in particular the damping factor. The output of filter 104 is an error voltage $V_e$ which is coupled to the input of the voltage controlled oscillator (VCO) 106. In the Laplace domain, the transfer function for loop filter 104 is:

$$V_e/I_p = R + 1/Cs \qquad (2).$$

The output frequency of VCO 106 is directly proportional to the input error voltage $V_e$:

$$W_o = K_v V_e \qquad (3),$$

wherein $W_o$ is the radian frequency output and $K_v$ is the gain factor for VCO 106. In the mathematical analysis of phase locked loops, however, we are interested in the instantaneous phase $P_o$ of the output signal. Since frequency is the derivative of phase ($W = dP/dt$, or, in the Laplace domain, $W = sP$), the transfer function for the VCO is:

$$P_o/V_e = K_v/s \qquad (4).$$

In FIG. 3A, the output current $I_p$ of phase detector/charge pump 102 is illustrated graphically for the situation in which the phase locked loop is initially out of lock and the phase $P_f$ of the feedback signal lags the phase $P_i$ of the input signal. Referring to this figure, a series of current pulses 302–305 of magnitude $I_{peak}$ occur periodically as the loop attempts to lock. Before the loop locks, an overshoot occurs which is represented by a negative current pulse 306. The error voltage $V_e$ at the input of VCO 106 is the sum of the voltage $V_c$ across capacitor C and the voltage $V_r$ across resistor R. These voltages are illustrated respectively in FIGS. 3B and 3C. Voltage $V_c$ is the integral of the current $I_p$ and consequently "ramps up" at 308–311 and "ramps down" at 312. In between these current pulses 302–306, the output current $I_p$ of phase detector/charge pump 102 goes to zero and the output impedance goes to infinity. Thus, assuming that the input impedance of the VCO is also infinite, the voltage $V_c$ that is present at the end of each current pulse 302–306 is held constant by capacitor C. Since the voltage across a resistor is simply the product of the current and the resistance, voltage pulses 314–317 occur simultaneously with current pulses 302–306 and have a magnitude of $I_{peak}R$. $V_e$ is illustrated graphically in FIG. 3D. Since $V_e$ is the sum of the voltages $V_c$ and $V_r$, $V_e$ includes voltage "spikes" 320–324 which are primarily the result of the voltage pulses 314–318 that develop across resistor R.

One of the primary applications for phase locked loops is in frequency synthesizers. The typical frequency synthesizer includes the circuit of FIG. 1 plus a programmable divider inserted between the output of VCO 106 and the feedback input of phase detector/charge pump 102. The divider has been eliminated from FIG. 1 because its presence would not effect the mathematical analysis of the present invention. (Without the divider, $P_f = P_o$, as illustrated in FIG. 1). A multiplicity of frequencies can be synthesized with such a circuit simply by programming the variable divider to divide by different numbers. Unfortunately, every time the divider is reprogrammed, the phase locked loop unlocks momentarily causing undesirable spurious frequencies to be generated at the VCO output as the VCO tracks the voltage spikes 320–324 at the VCO input. Even when the loop is locked, minor phase corrections are still necessary and current pulses periodically appear at the output of phase detector/charge pump 102, resulting in spurious VCO frequencies.

In the design of frequency synthesizers, it is often desirable to increase the lock time of the loop, that is, to decrease the time between a change in the variable divider and the time the phase locked loop recovers phase lock. As a general rule, this time will be inversely proportional to the "natural frequency" of the loop. The closed loop transfer function for the phase locked loop is:

$$\frac{P_o}{P_i} = \frac{\left(\frac{K_pK_v}{C}\right)(RCs + 1)}{s^2 + (K_pK_vR)s + \frac{K_pK_v}{C}}. \quad (5)$$

From control theory, we know that the denominator of a second order equation can be placed in the following form:

$$s^2 + 2dW_ns + W_n^2 \quad (6).$$

wherein d is the damping factor and $W_n$ is the natural frequency. Equating the denominator of the first equation with the second equation we get:

$$W_n = \sqrt{\frac{K_pK_v}{C}} \quad (7)$$

and $$d = \frac{R}{2}\sqrt{K_pK_vC}. \quad (8)$$

The natural frequency of the loop can be increased by a factor of n while maintaining the damping factor constant if the magnitude $I_{peak}$ of the output current $I_p$ (which is directly proportional to $K_p$) of the phase detector/charge pump 102 is increased by a factor of $n^2$, while the resistance R is decreased by a factor of n. In other words, if $n^2K_p$ is substituted for $K_p$, and R/n is substituted for R in the two equations immediately above, $W_n$ will be n times larger than it was before, but d remains the same.

Unfortunately, there are practical limitations to this technique for decreasing lock time. The undesirable voltage spikes 320-324 that develop across resistor R, would be larger by a factor of n if the magnitude $I_{peak}$ of the output current $I_p$ were to be increased by $n^2$ while only reducing R by a factor of n. This would not only increase the spurious frequency output of the VCO, but would also cause the circuit to exceed dynamic range limitations. For example, if a phase locked loop is designed such that the voltage pulses 314-318 developed across resistor R are ±5 Volts and the available power supply voltage is ±10 Volts, and if it is desired to decrease lock time by a factor of 10 (by increasing the output current $I_p$ by $10^2$ and decreasing resistance R by 10), the theoretical peak voltage developed across resistor R would be ±50 Volts. But ±50 Volts is beyond the limits of the power supply. Consequently, such an attempt at decreasing lock time would fail and result in the introduction of severe non-linearities into the circuit.

Accordingly, the invention described below eliminates the resistor R from the loop (i.e., a resistor-less or ideal integration loop), but maintains the dynamic characteristics (e.g., damping factor) of the conventional loop. Thus, the natural frequency $W_n$ of the loop may be increased (thereby decreasing lock time) without the spurious frequencies and potential non-linear circuit problems caused by the resistor R in the conventional loop.

Before describing the preferred embodiment of the invention it will be helpful to develop a mathematical model of the conventional phase locked loop so that a comparison can be made between the mathematical model of the present invention and the mathematical model of the conventional loop. Although the closed loop equation has already been described, the open loop equation is also indicative of loop performance and is generally easier to deal with. The open loop equation for the conventional phase locked loop is simply the multiplication of the transfer functions for the phase detector/charge pump 102, the loop filter 104 and the VCO 106, and it can be written in the following form:

$$P_f/P_e = (K_pR + K_p/Cs)(K_v/s) \quad (9).$$

A graphical model of the open loop equation of the conventional phase locked loop is illustrated in FIG. 4.

SUMMARY OF THE INVENTION

Briefly, according to the invention, a fast locking phase locked loop includes a first integrator that provides a signal representing a function of the mathematical or ideal integral of the phase difference between an input signal and a feedback signal. A voltage controlled oscillator is coupled to the first integrator and provides a signal to a phase shifter that provides the phase shifted signal that represents a function of the phase of the signal from the VCO, and a function of the integral of the phase difference between the integrated signals.

BRIEF DESCRIPTION OF THE DRAWINGS

FIG. 6 is a schematic diagram of a phase modulator in accordance with the present invention.

FIGS. 7A-7C are timing diagrams that illustrate the preferred operation of the present invention.

DETAILED DESCRIPTION OF THE PREFERRED EMBODIMENT

Figure 1:
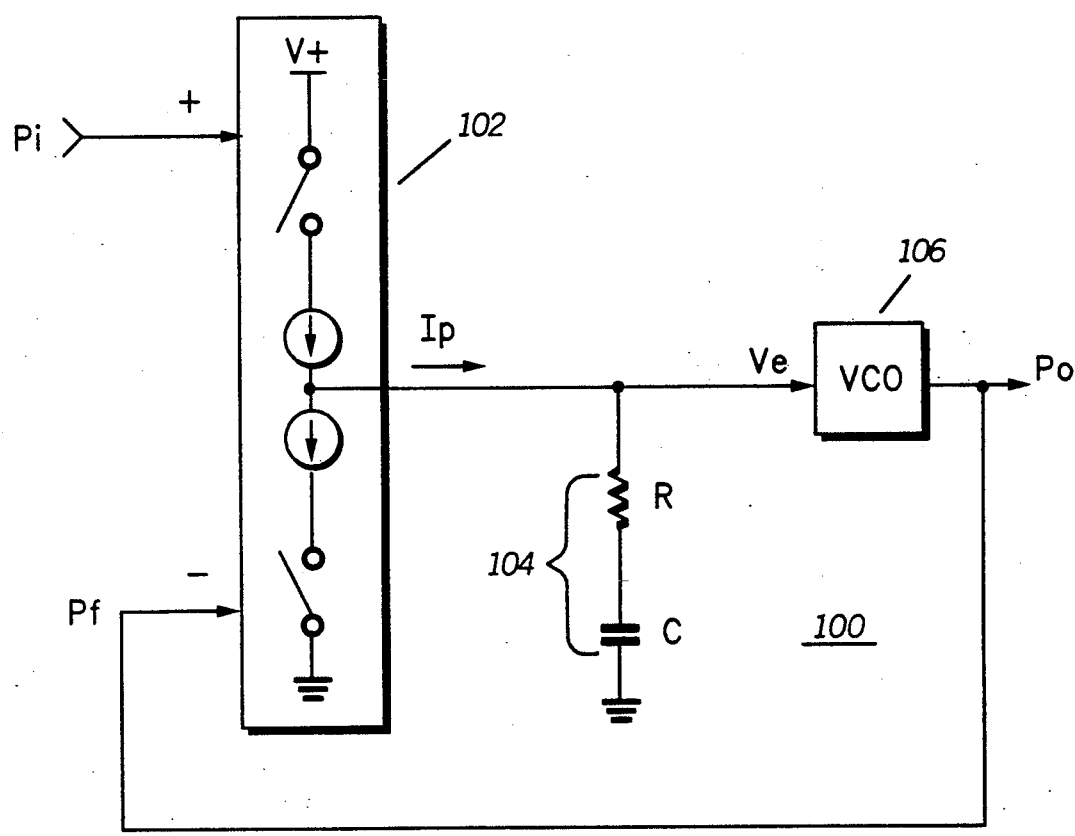
FIG. 1 is a schematic diagram of a conventional phase locked loop.
Figure 2A:
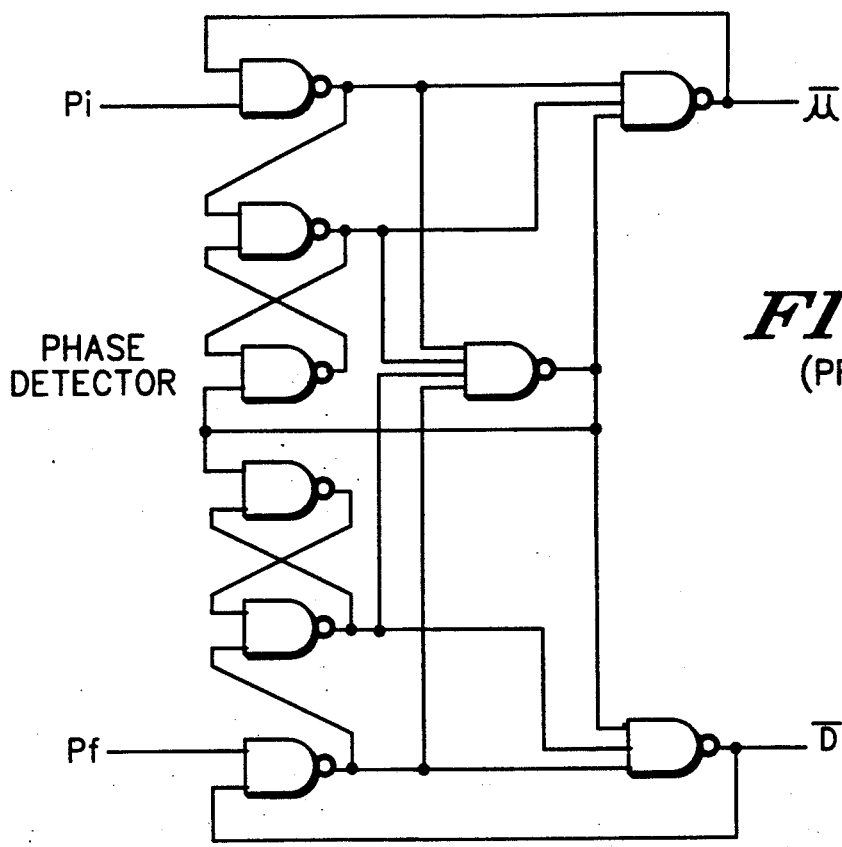
FIGS. 2A-2B are schematic diagrams of a conventional digital phase detector and a conventional charge pump respectively.
Figure 2B:
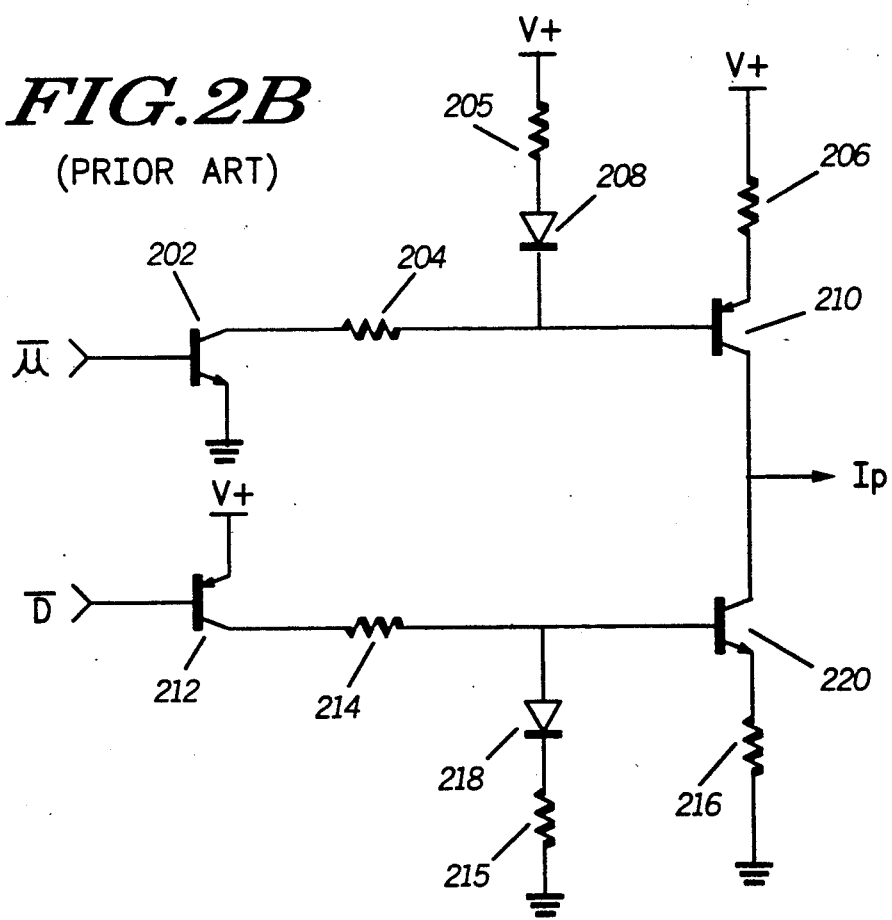
Figure 3A:
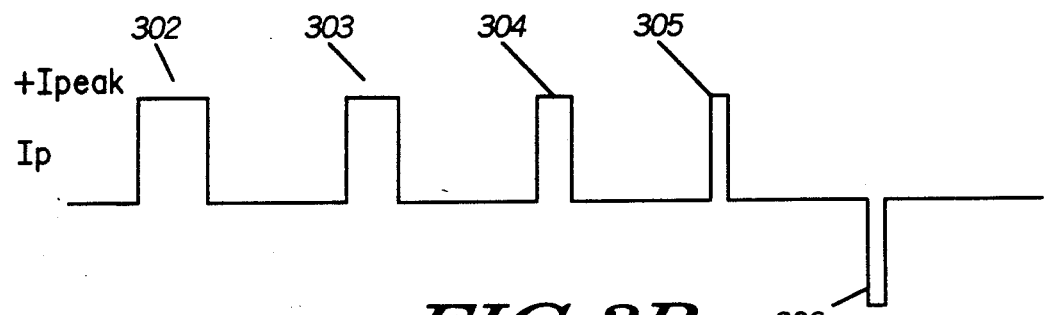
FIGS. 3A-3D are timing diagrams that illustrate the operation of the phase locked loop of FIG. 1.
Figure 3B:
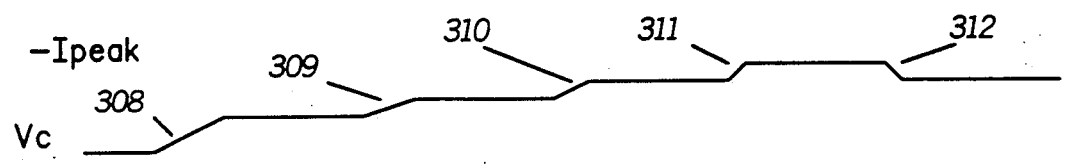
Figure 3C:
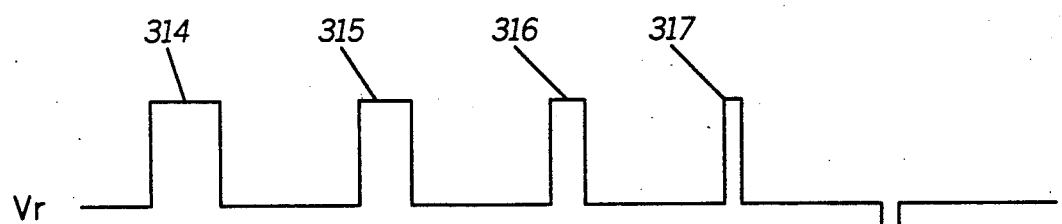
Figure 3D:
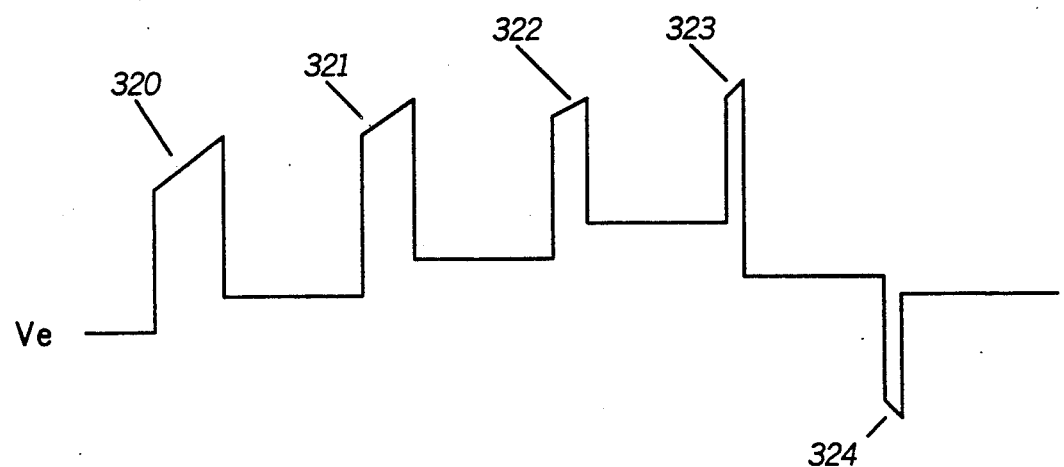
Figure 4:
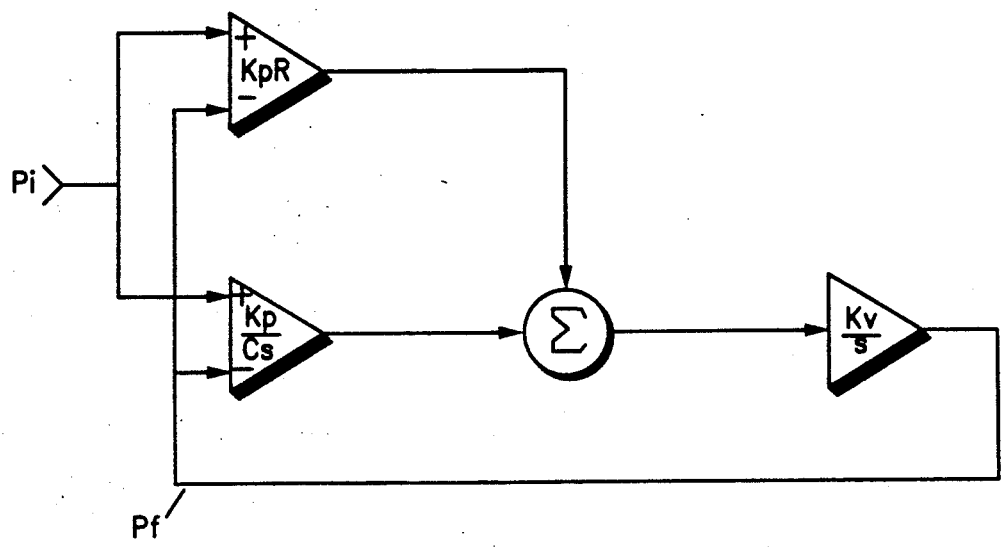
FIG. 4 is an analog representation of the open loop equation for the conventional phase locked loop of FIG. 1.
Figure 5:
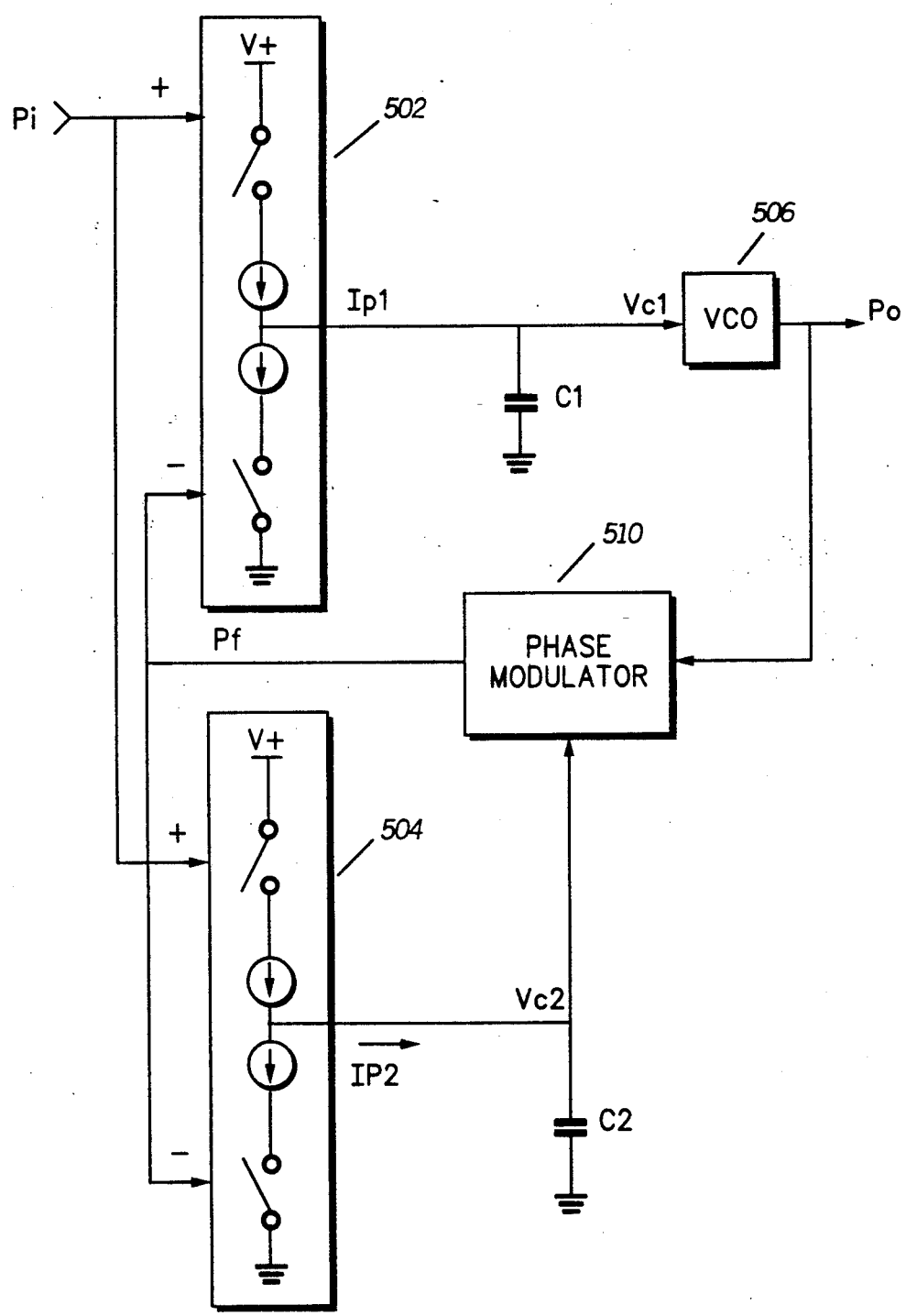
FIG. 5 is a block diagram of a phase locked loop in accordance with the present invention.

In FIG. 5, a block diagram of a phase lock loop in accordance with the present invention is illustrated. Referring to this Figure, phase detector/charge pumps 502 and 504 are similar to phase detector/charge pump 102 described above. Phase detector/charge pump 502 and capacitor $C_1$ are interconnected to form a first integrating means wherein the signal at the output (i.e., the voltage across the capacitor) is integrated (summed) resulting in a capacitor voltage that is a function of the integral of the phase difference between signals at the $P_i$ and $P_f$ inputs. According to the invention, the resistor commonly employed in conventional phase locked loops (see FIG. 1) is eliminated to form an ideal or mathematically perfect integration. The elimination of the resistor places a transfer function pole at zero. The transfer function of the integration is:

$$V_{c1}/P_e = K_{p1}/C_1s \quad (10),$$

wherein $V_{c1}$ is the voltage across capacitor $C_1$, $P_e$ is the phase error $(P_i - P_f)$ and $K_{p1}$ is the gain factor for phase detector/charge pump 502 (which is directly proportional to the magnitude of the output current $I_{p1}$).

The voltage controlled oscillator VCO 506 is well known in the art and its transfer function is:

$$P_o/V_{c1} = K_{v1}s \tag{11}$$

wherein $P_o$ is the phase of the output signal and $K_{v1}$ is the gain factor of VCO 506.

The overall transfer function is the product of these two transfer functions ((10) and (11)):

$$P_o/P_e = K_{p1}K_{v1}/C_1s^2 \tag{12}$$

Phase detector charge pump 504 and capacitor $C_2$ are also interconnected and integrate the output signal in a manner substantially similar to that described above. Accordingly, this transfer function is:

$$V_{c2}/P_e = K_{p2}/C_2s \tag{13}$$

wherein $V_{c2}$ is the voltage across capacitor $C_2$ and $K_{p2}$ is the gain factor of phase detector/charge pump 504. A phase modulator 510 outputs a signal having a phase $P_f$ that is equal to the phase $P_o$ of an input signal which has been shifted in phase in proportion to the input voltage $V_{c2}$. Thus, the phase modulator can be described by the equation:

$$P_f = P_o + K_m V_{c2} \tag{14}$$

wherein $K_m$ is the phase modulator gain constant. The second integration (phase detector/charge pump 504 and capacitor $C_2$) and phase modulator 510 are interconnected to form a phase shifter wherein the phase $P_f$ of the output signal is a function of the phase $P_o$ of the input signal plus a function of the integral of the phase difference between the $P_i$ and $P_f$ inputs of phase detector/charge pump 504 (which are connected to the $P_i$ and $P_f$ inputs of the first integration arrangement provided by the charge pump 502 and C1). Thus, solving equation (13) for $V_{c2}$ and substituting the result into equation 14, yields:

$$P_f = P_o + (K_m K_{p2}/C_2 s)P_e \tag{15}$$

Equation 12 describes the overall transfer function for the first integration and the VCO. Solving this equation for $P_o$ and substituting the result into equation 15, yields the open loop equation for the present invention:

$$\frac{P_f}{P_e} = \frac{K_{p1}K_{v1}}{C_1}\frac{1}{s^2} + \frac{K_m K_{p2}}{C_2}\frac{1}{s} \tag{16}$$

As can be seen by examining equation (16), the transfer function has a pole at zero and is not dependent upon any resistive value. Thus, the arrangement of the present invention provides ideal or mathematically perfect integrations via capacitors C1 and C2. The full advantage of this arrangement will be discussed hereinafter in greater detail.

Figure 8:
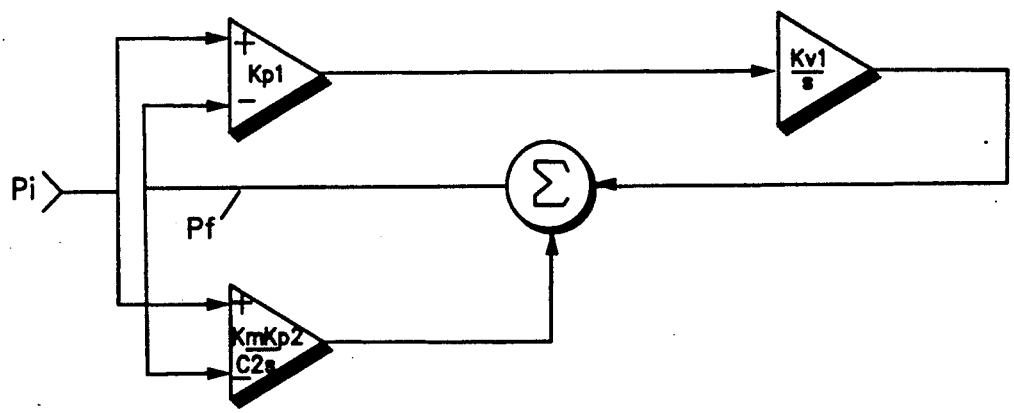
FIG. 8 is an analog representation of the open loop equation of the present invention.

Referring to FIG. 8, an analog representation of the open loop equation (16) of the present invention is illustrated. The open loop equation (16) for the present invention is facially similar to equation (9), which is the open loop equation for the conventional phase locked loop. However, rearranging the terms in the open loop equation for the conventional loop yields:

$$\frac{P_f}{P_e} = \frac{K_p K_v}{C}\frac{1}{s^2} + K_p K_v R \frac{1}{s} \tag{17}$$

Comparing equations 16 and 17, it should be readily apparent that the open loop equations for the present invention and the conventional loop differ only in their respective constants (K's, C's and R's). Therefore, via carefully selection for these constants, the open loop equation for the present invention can be made to be identical to the open loop equation of the conventional loop. For identical open loop performance, the constants should be selected such that:

$$(K_{p1}K_{v1}/C_1) = (K_p K_v/C) \tag{18}$$

and $$(K_m K_{p2}/C_2) = (K_p K_v R) \tag{19}$$

Accordingly, by an appropriate selection of the parameters (gain factors $K_{p1}$, $K_{p2}$ and $K_m$, and capacitors $C_1$ and $C_2$) of the present invention, the lock time of the loop can be decreased by increasing the natural frequency of the loop without encountering the limitations inherent in the use of the resistor R in the conventional loop. The gain factors $K_{p1}$, $K_{p2}$ and $K_m$ are all easily adjustable using conventional techniques such as merely adjusting current sources in the circuit, thereby making the present invention ideally suited for integrated circuits.

A detailed schematic of phase modulator 510 is illustrated in FIG. 6 and the operation of the phase modulator is illustrated in FIGS. 7A-7C. Referring to these figures, the VCO output is coupled to the gate of a transistor 602 (in most applications, a frequency divider couples the VCO output to the gate). A well known current source 604 sources current to capacitor C3 causing the voltage at the non-inverting input of voltage comparator 606 to "ramp up", as illustrated by voltage $V_{c3}$ in FIG. 7B. Thus, current source 604 and capacitor C3 form a ramp generator. When $P_o$ goes positive, e.g., pulses 702-705, transistor 602 saturates and dumps the charge on capacitor C3, resulting in the "saw tooth" waveform $V_{c3}$ of FIG. 7B. The output $V_{c2}$ of the second integrating means (phase detector/charge pump 504 and the capacitor $C_2$) is also illustrated in FIG. 7B. At 706 and 707, capacitor $C_2$ integrates a negative output pulse (not illustrated in FIG. 7) from phase detector/charge pump 504 and, consequently, $V_{C2}$ "ramps down" at these points. Similarly, at 708, capacitor $C_2$ integrates a positive output pulse from phase detector/charge pump 504 and $V_{C2}$ "ramps up" at this point. Also illustrated in FIG. 7B is a voltage $V_{C2}'$, which is the voltage that would result if there were no phase error ($P_i = P_f$, and, consequently, $I_{p2}=0$) at 706-708.

As the voltage $V_{C3}$ on the non-inverting input of comparator 606 ramps up, it eventually exceeds the voltage $V_{C2}$ on the inverting input of the comparator. At this point, the output $P_f$ of comparator 606 changes state, as illustrated by leading edges 710-712 of FIG. 7C. Since the precise point that the output changes (i.e., the precise position of the leading edge of the input pulses $P_f$) is dependent upon the voltage $V_{C2}$ at the inverting input of comparator 606, and, since the voltage $V_{C2}$ changes anytime there's a phase error $P_e$, the phase $P_f$ of the output signal will be phase modulated. More specifically, the phase $P_f$ of the output signal is a function of the phase $P_o$ of the input signal and a function of the integral of the phase error $P_e$. This can be seen in FIGS. 7A and 7C wherein the time relationship between the leading edges of the input pulses 702-705 and the leading edges 710-712 of the next output pulse $P_f$ is seen to change. If $V_{C2}$ does not change, (as illustrated in FIG. 7B by $V_{C2}'$) the time relationship between these leading edges will remain constant, as illustrated in FIG. 7C by leading edges 711' and 712'.

What is claimed is:

1. A phase locked loop, comprising:
   first integrating means for integrating having first and second inputs and an output, said first integrating means being constructed and arranged to provide a signal at said output of said first integrating means that represents a function of the mathematical integral of the phase difference between signals at said first and second inputs of said first integrating means;
   a voltage controlled oscillator, the input of said voltage controlled oscillator being coupled to the output of said first integrating means; and
   phase shifting means for phase shifting having an input and an output, wherein the phase of the signal at said output of said phase shifting means represents a function of the phase of the signal at said input of said phase shifting means and a function of the integral of the phase difference between signals at said first and second inputs of said first integrating means, said input of said phase shifting means being coupled to the output of said voltage controlled oscillator and said output of said phase shifting means being coupled to said second input of said first integrating means, said phase shifting means further includes a phase modulator having a first input and an output, said first input of said phase modulator being coupled to said output of said voltage controlled oscillator, and said output of said phase modulator being coupled to said second input of said first integrating means.

2. The phase locked loop of claim 1, wherein said phase shifting means includes second integrating means for integrating having first and second inputs and an output, said second integrating means being constructed and arranged to provide a signal at said output of said second integrating means that represents a function of the mathematical integral of the phase difference between signals at said first and second inputs of said second integrating means, said first and second inputs of said second integrating means being coupled respectively to said first and second inputs of said first integrating means, and said output of said second integrating means being coupled to a second input of said phase modulator.

3. A phase locked loop, comprising:
   first integrating means for integrating having first and second inputs and an output, said first integrating means being constructed and arranged to provide a signal at said output of said first integrating means that represents a function of the mathematical integral of the phase difference between signals at said first and second inputs of said first integrating means:
   a voltage controlled oscillator, the input of said voltage controlled oscillator being coupled to the output of said first integrating means:
   phase shifting means for phase shifting having an input and an output, wherein the phase of the signal at said output of said phase shifting means represents a function of the phase of the signal at said input of said phase shifting means and a function of the integral of the phase difference between signals at said first and second inputs of said first integrating means, said input of said phase shifting means being coupled to the output of said voltage controlled oscillator and said output of said phase shifting means being coupled to said second input of said first integrating means, said phase shifting means including a phase modulator having a first input and an output, said first input of said phase modulator being coupled to said output of said voltage controlled oscillator, and said output of said phase modulator being coupled to said second input of said first integrating means, said phase shifting means further including a second integrating means for integrating having first and second inputs and an output, said second integrating means being constructed and arranged to provide a signal at said output of said second integrating means that represents a function of the mathematical integral of the phase difference between signals at said first and second inputs of said second integrating means, said first and second inputs of said second integrating means being coupled respectively to said first and second inputs of said first integrating means, and said output of said second integrating means being coupled to a second input of said phase modulator. said second integrating means further including a phase detector having first and second inputs and an output, the first and second inputs of the phase detector being coupled respectively to the first and second inputs of the second integrating means, a charge pump having an input and an output, the input being coupled to the output of the phase detector and a capacitor coupled to the output of said charge pump.

4. A phase locked loop, comprising:
   first integrating means for integrating having first and second inputs and an output, said first integrating means being constructed and arranged to provide a signal at said output of said first integrating means that represents a function of the mathematical integral of the phase difference between signals at said first and second inputs of said first integrating means. further includes a phase detector having first and second inputs and an output, the first and second inputs of the phase detector being coupled respectively to the first and second inputs of the first integrating means, a charge pump having an input and an output, the input being coupled to the output of the phase detector and a capacitor coupled to the output of said charge pump:
   a voltage controlled oscillator, the input of said voltage controlled oscillator being coupled to the output of said first integrating means: and
   phase shifting means for phase shifting having an input and an output, wherein the phase of the signal at said output of said phase shifting means represents a function of the phase of the signal at said input of said phase shifting means and a function of the integral of the phase difference between signals at said first and second inputs of said first integrating means, said input of said phase shifting means being coupled to the output of said voltage controlled oscillator and said output of said phase shifting means being coupled to said second input of said first integrating means.

5. A phase locked loop, comprising:

first integrating means for integrating having first and second inputs and an output, said first integrating means being constructed and arranged to provide a signal at said output of said first integrating means that represents a function of the mathematical integral of the phase difference between signals at said first and second inputs of said first integrating means:

a voltage controlled oscillator, the input of said voltage controlled oscillator being coupled to the output of said first integrating means: and phase shifting means for phase shifting having an input and an output, wherein the phase of the signal at said output of said phase shifting means represents a function of the phase of the signal at said input of said phase shifting means and a function of the integral of the phase difference between signals at said first and second inputs of said first integrating means, said input of said phase shifting means being coupled to the output of said voltage controlled oscillator and said output of said phase shifting means being coupled to said second input of said first integrating means, said phase shifting means including a phase modulator having a first input and an output, said first input of said phase modulator being coupled to said output of said voltage controlled oscillator, and said output of said phase modulator being coupled to said second input of said first integrating means. Said phase modulator further including a sawtooth generator and a comparator, the input of said generator being coupled to the output of said voltage controlled oscillator, the output of said generator being coupled to an input of said comparator, and the output of said comparator being coupled to said second input of said first integrating means.

6. A phase locked loop, comprising:

first integrating means for integrating, comprising:

phase detection means having first and second inputs and an output, the phase detection means being constructed and arranged to provide a signal at said output that represents a function of the phase difference between signals at said first and second inputs of said phase detection means; and resistor-less filtering means for filtering the signal at the output of said phase detection means to provide an integration signal that is a function of the integral of the phase difference between signals at said first and second inputs of said phase detection means;

a voltage controlled oscillator, the input of said voltage controlled oscillator being arranged to receive said integration signal; and phase shifting means for phase shifting having an input and an output, wherein the phase of the signal at said output of said phase shifting means is a function of the phase of the signal at said input of said phase shifting means and a function of the integral of the phase difference between signals at said first and second inputs of said phase detection means, said input of said phase shifting means being coupled to the output of said voltage controlled oscillator and said output of said phase shifting means being coupled to said second input of said phase detection means, said phase shifting means further including a second integrating means for integrating having first and second inputs and an output, said second integrating means being constructed and arranged to provide a signal at said output of said second integrating means that represents a function of the mathematical integral of the phase difference between signals at said first and second inputs of said second integrating means, said first and second inputs of said second integrating means being coupled respectively to said first and second inputs of said first integrating means, and said output of said second integrating means being coupled to a second input of said phase modulator.

7. A phase locked loop, comprising:

first integrating means for integrating having first and second inputs and an output, said first integrating means being constructed and arranged to have a pole at zero wherein the signal at said output of said first integrating means is a function of the integral of the phase difference between signals at said first and second inputs of said first integrating means, said first integrating means further includes a phase detector having first and second inputs and an output, the first and second inputs of the phase detector being coupled to the first and second inputs of the first integrating means, a charge pump having an input and an output, the input being coupled to the output of the phase detector and a capacitor coupled to the output of said charge pump;

a voltage controlled oscillator, the input of said voltage controlled oscillator being coupled to the output of said first integrating means; and phase shifting means for phase shifting having an input and an output, wherein the phase of the signal at said output of said phase shifting means is a function of the phase of the signal at said input of said phase shifting means and a function of the integral of the phase difference between signals at said first and second inputs of said first integrating means, said input of said phase shifting means being coupled to the output of said voltage controlled oscillator and said output of said phase shifting means being coupled to said second input of said first integrating means.

* * * * *